United States Patent
Acharya et al.

(10) Patent No.: US 6,731,706 B1
(45) Date of Patent: May 4, 2004

(54) SQUARE ROOT RAISED COSINE SYMMETRIC FILTER FOR MOBILE TELECOMMUNICATIONS

(75) Inventors: Tinku Acharya, Chandler, AZ (US); George J. Miao, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/429,058

(22) Filed: Oct. 29, 1999

(51) Int. Cl.[7] .................................................. H04B 1/10
(52) U.S. Cl. ....................................................... 375/350
(58) Field of Search ................................. 375/350, 147, 375/150, 230; 708/300, 313, 301

(56) References Cited

U.S. PATENT DOCUMENTS

| | | | | | |
|---|---|---|---|---|---|
| 5,559,901 A | * | 9/1996 | Lobregt | ....................... | 382/256 |
| 5,870,431 A | * | 2/1999 | Easton et al. | ................ | 375/230 |
| 6,141,372 A | * | 10/2000 | Chalmers | ..................... | 375/147 |

* cited by examiner

*Primary Examiner*—Stephen Chin
*Assistant Examiner*—Curtis Odom
(74) *Attorney, Agent, or Firm*—Trop, Pruner & Hu, P.C.

(57) ABSTRACT

A symmetric discrete-time square-root-raised-cosine filter may be utilized to process a serial input signal and to produce an output square in each clock cycle. The filter may be adapted to decrease the computational complexity of the resulting calculations, making the filter amenable to use in power sensitive applications and in those situations where the available processor's performance is relatively limited.

23 Claims, 9 Drawing Sheets

US 6,731,706 B1

SQUARE ROOT RAISED COSINE SYMMETRIC FILTER FOR MOBILE TELECOMMUNICATIONS

BACKGROUND

This invention relates generally to digital wireless mobile communications.

Code division multiple access (CDMA) for digital wireless mobile communications involves using correlation techniques to allow a receiver to decode one signal among many that are transmitted on the same carrier at the same time. Each user's signal includes a unique code that appears to be noise to all except the correct receiver. A channel in the code domain describes a combination of a carrier frequency and a code. CDMA generally starts out with a narrow band signal, which for full speech is 9600 bps. This signal is spread with the use of specialized codes to a bandwidth of 1.23 Mz. The ratio of the spread data rate to the initial data rate is called the processing gain.

When transmitted, a CDMA signal experiences a high level of interference, dominated by the coded signals of other CDMA users. This interference may take two forms. Interference may arise from other users in the same cell and interference may occur from adjacent cells. The total interference also includes background noise and other spurious signals. When the signal is received, the desired signal is recovered and the interference is rejected. A correlator uses processing gain to pull the desired signal out of the noise.

Currently available cellular technology makes use of what is called second generation or "2G" technology. Initially, cellular telephone technology was implemented with Advanced Mobile Phone Systems (AMPS) which were analog. In about 1995, digital systems, such as CDMA, were introduced.

A number of competing third generation or "3G" technologies are being debated within the industry at this time. The goal of the 3G technologies is to offer higher bit rate services. Such services may include multimedia, including video, Internet and electronic mail.

One standard for 3G technologies is the IMT-2000 standard which was propounded by the International Telecommunications Union (ITU). IMT stands for International Mobile Telecommunications and IMT-2000 is the name for Future Public Land Mobile Telecommunications Systems (FPLMTS). FPLMTS is targeted at developing mobile telecommunications systems to be used "anywhere-anyplace" around the year 2000 operating at approximately 2000 MHz.

In 3G technology, a "bit" is the fundamental information unit of input data. A "symbol" is a grouping of data bits based on modulation. Thus, a symbol arises after encoding but prior to spreading. A "chip" is the minimum bit period of the final spread data. "Channels" include physical channels that are transmitted in the air, defined by a frequency and code. A transport channel is defined by how the data is sent and logical channels are defined by the type of data.

The so-called wideband or W-CDMA technology has been proposed as the 3G solution by the European Telecommunications Standards Institute (ETSI) as their proposal to the ITU for IMT-2000. ETSI's proposal is identified as UTRA (Universal Mobile Telecommunication System Terrestrial Radio Access). (The standard can be found at www.itu.int/imt/2-radio_dev/proposals/index.html.)

In digital wireless mobile communications, the pulses that make up each symbol may be spread in time. However, the pulses, in some cases, may smear into time intervals of succeeding symbols when rectangular pulses are passed through a band limited channel. This problem is called intersymbol interference (ISI). ISI may lead to an increased probability of a receiver making an error in detecting a symbol.

Thus, there is a continuing need for higher bit rate cellular telephones that are less prone to intersymbol interference.

SUMMARY

In accordance with one aspect, a square-root-raised-cosine filter may include a symmetric finite impulse response filter generating an output ripple signal having a magnitude at a frequency of one half of the chip rate of about 3 decibels less than the normalized gain.

Other aspects are set forth in the accompanying detailed description and claims.

DETAILED DESCRIPTION

Figure 1:
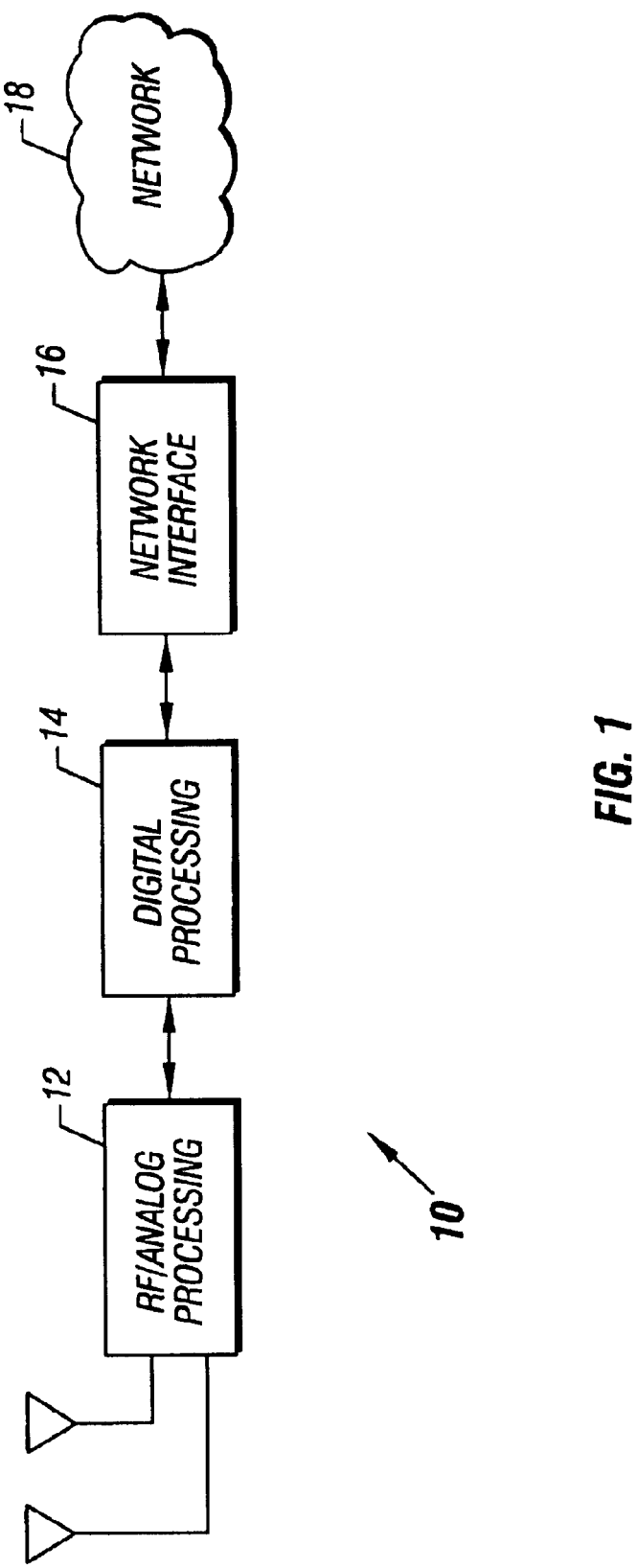
FIG. 1 is a block diagram showing one embodiment of a transceiver in accordance with the present invention.

Referring to FIG. 1, a transceiver 10 in accordance with one embodiment of the present invention includes a radio frequency/analog processing section 12 which is coupled to transmitting and receiving antennas. The analog processing section 12 is coupled to a digital processing section 14. A network interface 16 interfaces the system with a telephone network 18. In accordance with one embodiment of the present invention, the system 10 is a so-called W-CDMA cellular transceiver that both receives and transmits information.

Figure 2:
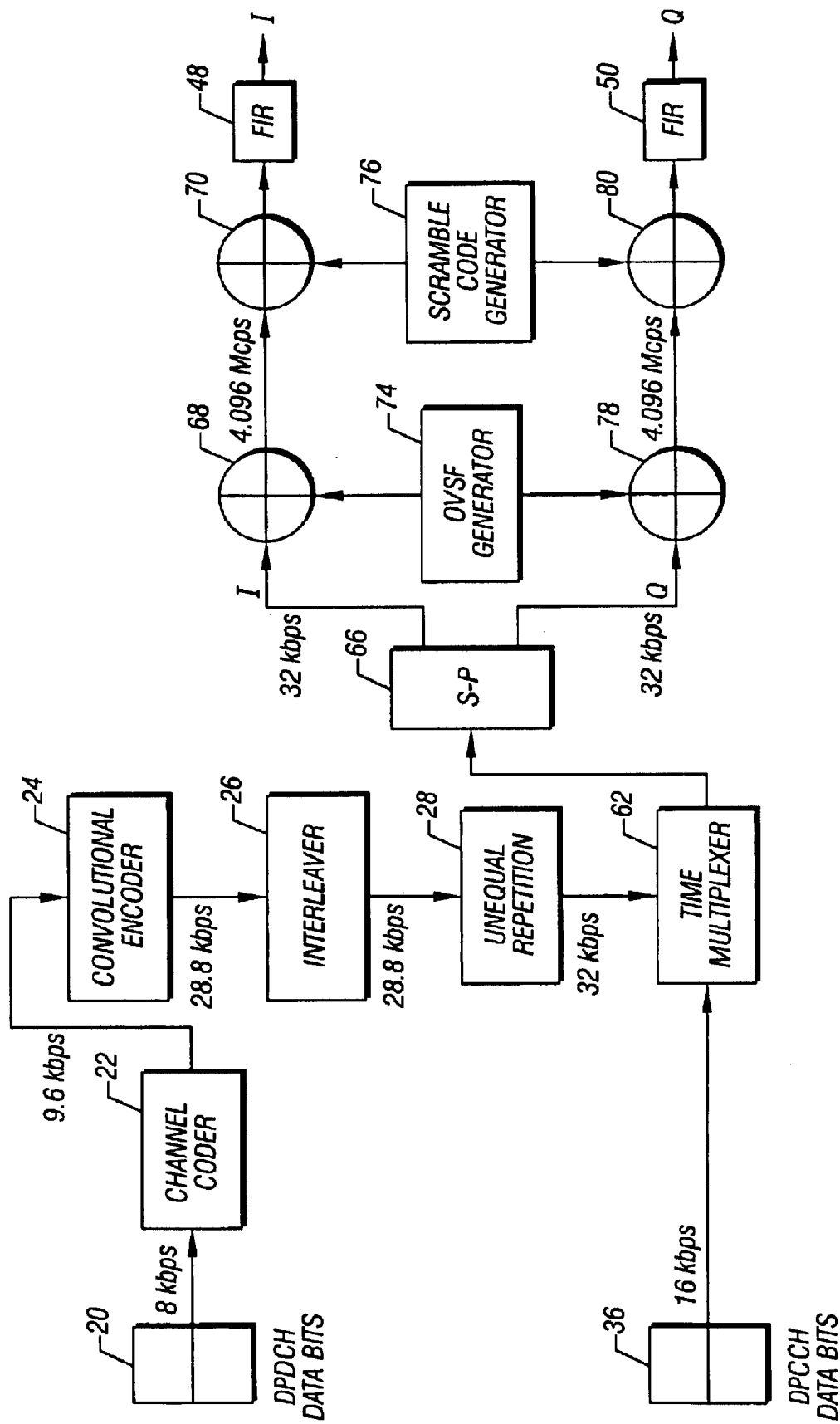
FIG. 2 is a block diagram showing a transmitter section of the transceiver shown in FIG. 1.

A downlink dedicated physical channel, shown in FIG. 2, receives dedicated physical data channel (DPDCH) 20 user data bits, such as voice data at eight kilobits per second. A channel coder 22 adds cyclic redundancy check (CRC) and tail bits to the data. The CRC aids in the detection of errors. The data is then passed through a one-third rate convolution encoder 24 which may triple the rate by adding redundancy. The data is interleaved in an interleaver 26. An unequal repetition stage 28 may raise the data rate, for example to 32 Kbps. The data bits are multiplexed, by a multiplexer 62, with control information from the dedicated physical control channel (DPCCH) 36 that contains control data. Control information may be pilot bits, transmit power control bits (TPC), and rate information or transmit format indicator bits (TFI).

A serial-to-parallel converter 66 converts the data and maps the data to the I and Q branches respectively. The I and Q branches are then spread to a 4.096 Mcps rate with the same orthogonal variable spreading factor (OVSF) code by the generator 74 and logic devices 68 and 78 (such as exclusive OR gates). The OVSF may have a code of 128 for example which means that the spreading code has the length of 128 chips. So for every symbol there are 128 chips (32 Kbps×128=4.096 Mcps). The OVSF code is effectively the channelization code. Next a scrambling code is applied by a generator 76, applied through logic devices (such as exclusive OR gates 70 and 80), that is unique to the local base station. The I and Q branches are filtered by filters 48 and 50 and the I and Q channels are routed for summing with other forward channels I and Q signals prior to IQ modulation.

Figure 3:
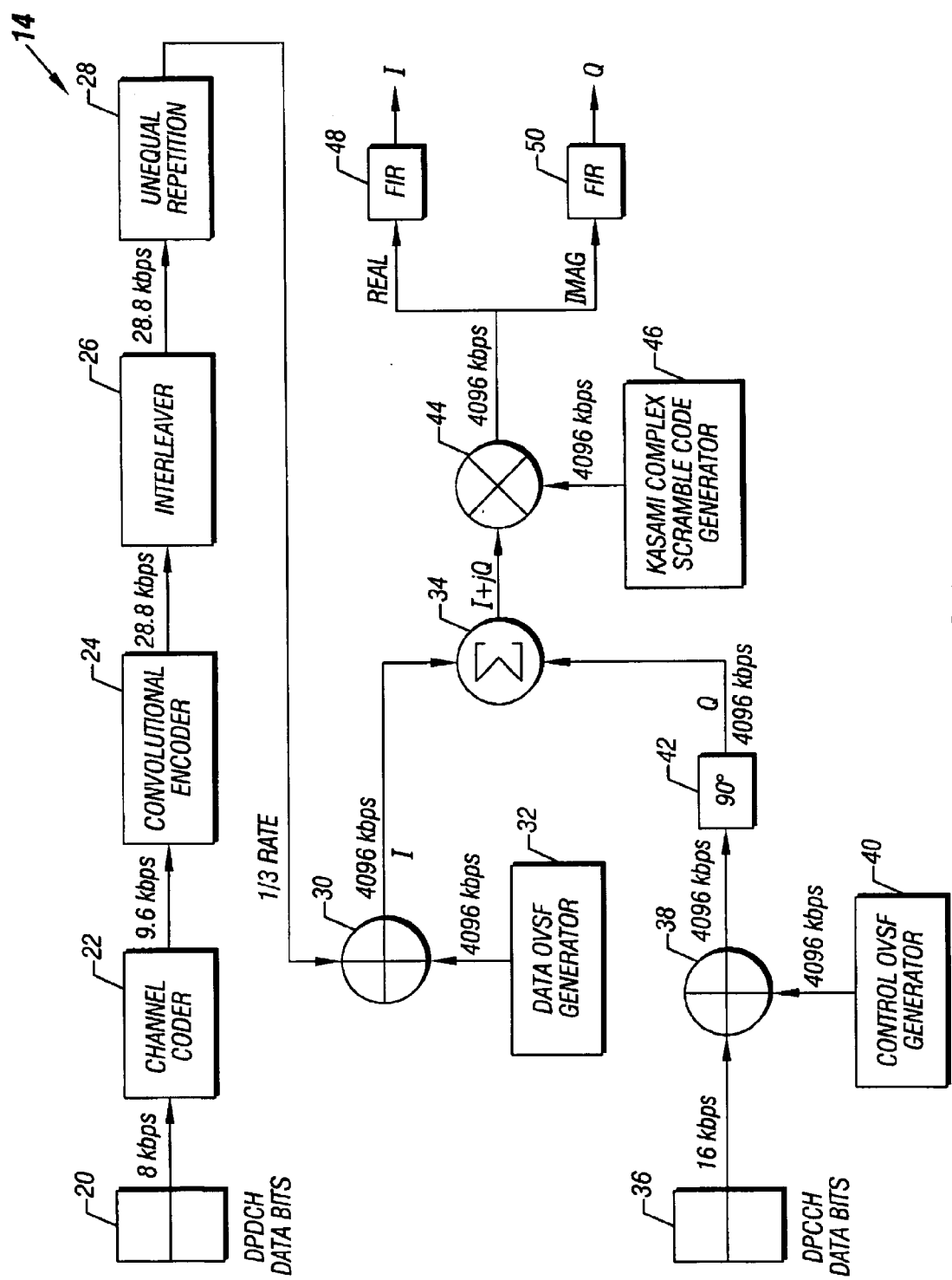
FIG. 3 is a block diagram of the receiver section of the transceiver shown in FIG. 1.

Referring next to FIG. 3, which shows the uplink dedicated physical channel, the 8 Kbps voice data is carried as traffic data on the DPDCH 20. Cyclic redundancy check and tail bits are added by the codec 22, convolutional encoded in an encoder 24, and interleaved (in an interleaver 26) as described in the downlink example. The data is mapped to the I branch and then spread, for example with an OVSF code with SF=128, to reach the 4.096 Mcps rate using the generator 32 and logic gate 30. The control data bits are mapped to the Q branch and also spread but with an OVSF code with SF=256, using generator 40 and logic gate 38, because the control data is at 16 Kbps. A phase shift may be supplied at 42. The branches are summed at 34 and then complex scrambled using the logic gate 44 and a generator 46.

An effective transfer function that may be used to simultaneously reduce the ISI defects and the spectral width of a modulated digital signal may use filters 48, 50 with square root transfer functions at both the transmitter and receiver. For example, the pulse shaping techniques in the ETSI and IMT-2000 standards of the 3G W-CDMA system are the square-root-raised-cosine (SRRC) filter with a roll off, α, equal to 0.22 in the frequency domain at both the receiver and transmitter.

The impulse response of a raised cosine filter is given by:

$$h_{RC}(t) = \left(\frac{\sin(\pi t/T_c)}{\pi t/T_c}\right)\left(\frac{\cos(\alpha \pi t)}{1-(2\alpha t/T_c)^2}\right),$$

where $T_c$ is the chip duration and α is the roll off factor with α equal to or less than one and greater than or equal to zero. The raised cosine filter can be approximated using finite impulse response (FIR) filters by truncating the pulses at some multiple of $T_c$.

The corresponding transfer function of a raised cosine filter can be obtained by taking the Fourier transform of the impulse response, and is given by:

$$H_{RC}(f) = \begin{cases} T_C & 0 \leq |f| \leq (1-\alpha)/2T_C \\ \frac{T_C}{2}\left[1-\sin\frac{\pi T_C}{\alpha}\left(f-\frac{1}{2T_C}\right)\right] & \frac{(1-\alpha)}{2T_C} \leq |f| \leq \frac{(1-\alpha)}{2T_C} \\ 0 & \text{otherwise} \end{cases}.$$

The SRRC roll off transfer function can be directly developed by using identical $[H_{RC}(f)]^{1/2}$ filters applied at both the transmitter and receiver to provide a matched filter in a flat fading mobile channel. The transfer function of the SRRC filter in the frequency domain is as follows:

$$H_{SRRC}(f) = \begin{cases} \sqrt{T_c} & 0 \leq |f| \leq (1-\alpha)/2T_c \\ \sqrt{\frac{T_c}{2}}\left[1-\sin\frac{\pi T_c}{\alpha}\left(f-\frac{1}{2T_c}\right)\right]^{\frac{1}{2}} & \frac{(1-\alpha)}{2T_c} \leq |f| \leq \frac{(1-\alpha)}{2T_c} \\ 0 & \text{otherwise} \end{cases}.$$

The corresponding impulse response of a square-root-raised-cosine filter can be obtained by taking the inverse Fourier transform of the transfer function of the SRRC filter and is given by:

$$h_{SRRC}(t) = \frac{T_C^{-\frac{1}{2}}}{1-(4\alpha t/T_c)^2}\left\{\frac{\sin[(1-\alpha)\pi t/T_c]}{\pi t/T_c} + \frac{4\alpha}{\pi}\cos[\pi(1+\alpha)t/T_c]\right\}.$$

The square-root-raised-cosine filter discussed so far is a continuous time filter. The square-root-raised-cosine filter may be converted from the continuous-time domain to the discrete-time domain.

A discrete-time signal is a signal defined at discrete times and thus the independent variable has discrete values. Discrete-time signals are represented as sequences of numbers.

Figure 4:
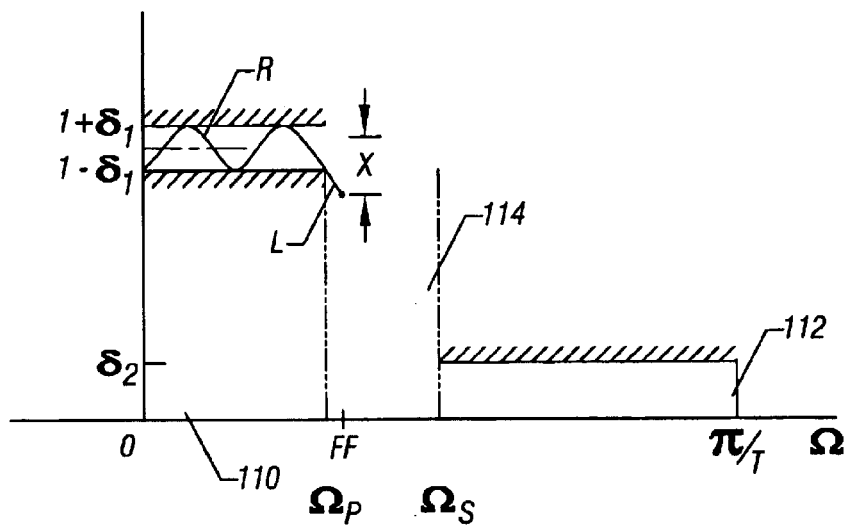
FIG. 4 is a block diagram showing one embodiment of the present invention.

The characteristics for effective frequency response of an SRRC filter in the continuous time domain are shown in FIG. 4. Specifically, the SRRC filter having the characteristics illustrated in FIG. 4 has the following properties when the sampling rate $F_s$ is at $2f_c$ (where the chip rate $f_c=1/T_c$) samples per second:

1. The gain $|H_{SRRC}(j\Omega)|$ is within $\pm\delta_1$ of unity in the frequency band 110

$$0 \leq \Omega \leq 2\pi\frac{(1-\alpha)}{2T_c},$$

called the passband, where $\Omega=2\pi f$.

2. The gain is equal to $\delta_2$ in the frequency band $$112 \; \Omega \geq \frac{(1+\alpha)}{2T_c}$$

called the stopband.

3. The passband frequency is $\Omega_p=2\pi(1-\alpha)/2T_c$.
4. The stopband frequency is $\Omega_s=2\pi(1+\alpha)/2T_c$.

Referring to FIG. 4, the fundamental frequency (FF) is equal to half of chip rate ($T_c/2$). Thus in an example with a chip rate of 4.096 Mcps, the fundamental frequency is 2.048 MHz. In FIG. 4, the ripple, indicated at R, has a portion L which has a value X of 3 dB below one (the normalized gain). Thus, the passband frequency 110 ($\Omega p$) may be extended slightly into the transition band 114 to the fundamental frequency, indicated as FF in FIG. 4, so that the ripple has a value of X below the normalized gain (equal to one). With this relationship, signals within the extended passband frequencies are not clipped off. In other words, to accurately emulate the operation of an SRRC filter using FIR filter design techniques, the criteria set forth above provides an adequate passband for a filter 48, 50.

The characteristics of the filters 48, 50 are shown in FIG. 4, where the limits of the approximation error are indicated by shaded lines. The tolerance scheme for the discrete-time SRRC filter may be the same as that of a continuous time domain filter and may be expressed as a function of normalized frequency ($\omega = \Omega T$) in the frequency range $0 \leq \omega \leq \pi$, because the remainder specification can be inferred from symmetry properties. As a result, the passband where the magnitude of the frequency response is approximately unity, with an error of plus or minus $\pm \delta_1$, is:

$$(1-\delta_1) \leq |H(e^{j\omega})| \leq (1+\delta_1) \ |\omega| \leq \omega_p.$$

The magnitude response of the fundamental frequency at the edge of 3 dB is given by, $$|H(e^{j\omega})| = (1+\delta_{3dB}) \ |\omega_{3dB}| = 0.5\pi.$$

The other approximation band is the stopband whose magnitude response is approximately zero with an error of less than $\delta_2$:

$$|H(e^{j\omega})| \leq \delta_2, \ \omega_s \leq |\omega| \leq \pi.$$

The filter may be designed using McClellan-Parks's method, also called equirripple approximations. Other techniques such as windowing may also be used. To meet the ETSI UMTS and IMT-2000 standard, a roll off factor of alpha equals 0.22, a chip rate is 4.096 Mcps and $\delta_1$ is equal to 1 dB and $\delta_2$ is equal to 40 dB. Other chip rates are also contemplated. Assuming the sampling rate $F_s = 2f_c = 2/T_c$ which equals 8.192 Mcps, the parameters shown in FIG. 4 are:

$$\omega_p > \Omega_p T = [2\pi(1-\alpha)/2T_c](T_c/2) = \frac{\pi}{2}(1-\alpha) = 0.39\pi \text{ and}$$

$$\omega_{3dB} = (2\pi/2T_c)(T_c/2) = 0.5\pi$$

$$\omega_s < \Omega_s T = [2\pi(1+\alpha)/2T_c](T_c/2) = \frac{\pi}{2}(1+\alpha) = 0.61\pi.$$

Note that the stopband frequency $(1+\alpha)/2T_c$ in the continuous-time domain is exactly equal to the half of occupied bandwidth of signals. In discrete-time domain, the edge of stopband frequency is needed to adjust a little bit to ensure that the transmitted signals are within the occupied bandwidth $(ob) = f_c(1+\alpha)$. So, the edge of stopband frequency in the discrete-time SRRC filter may equal to 99% of half of the occupied bandwidth of signals.

Figure 5:
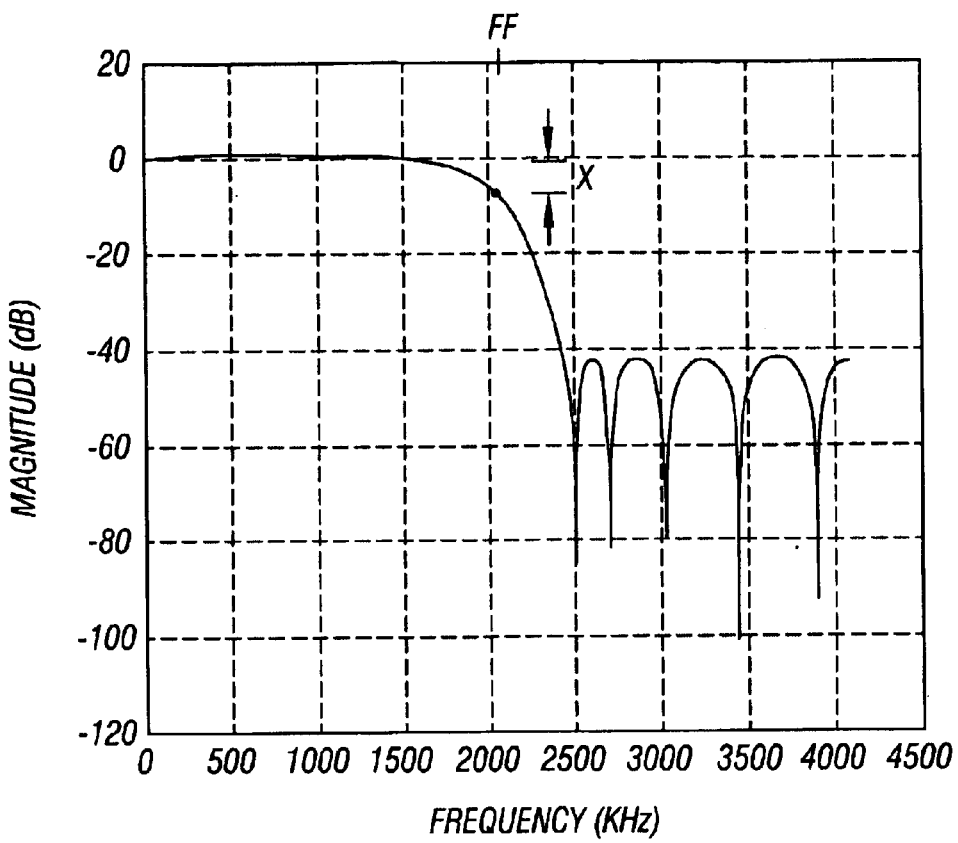
FIG. 5 is a graph of spectrum output of a SRRC filter with 40 dB in the Y-axis and frequency in the X-axis.
Figure 6:
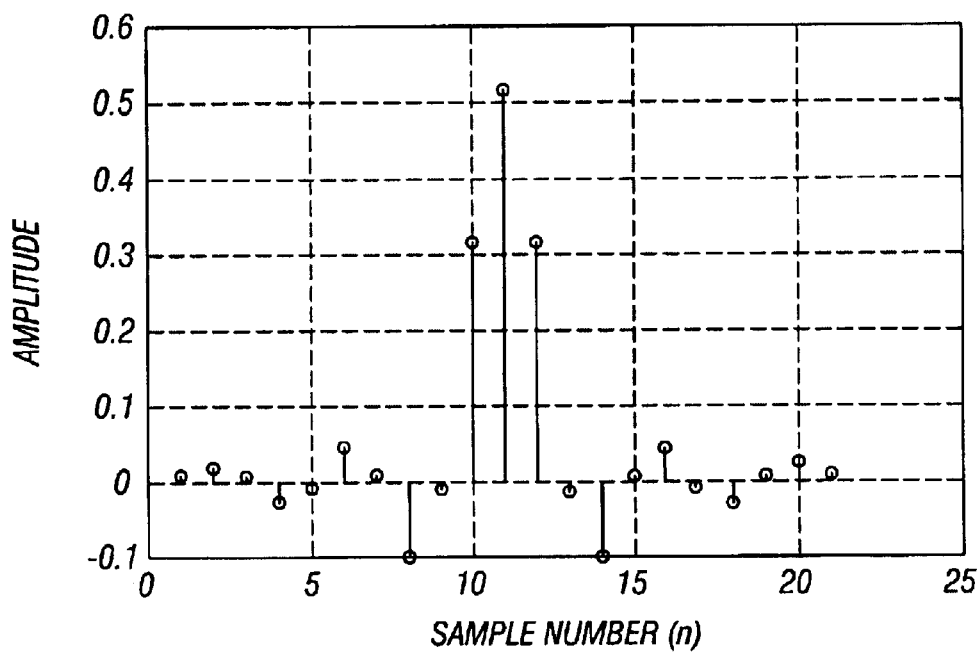
FIG. 6 is a plot of the impulse response of a discrete-time SRRC filter in accordance with one embodiment of the invention.

The spectrum output of the discrete-time SRRC filter with 40 dB in the y axis and frequency in the x axis is shown in FIG. 5. A 3 dB offset X exists at the fundamental frequency (FF), such as the fundamental frequency 2.048 for the chip rate 4.096 Mcps, as illustrated in FIG. 5. The corresponding impulse response of the discrete-time SRRC filter is plotted in FIG. 6. As shown in FIG. 6 $|C(\pm j)| \neq 0$ for $j = 2, 4, \ldots, N$ where N is an even integer.

Figure 6A:
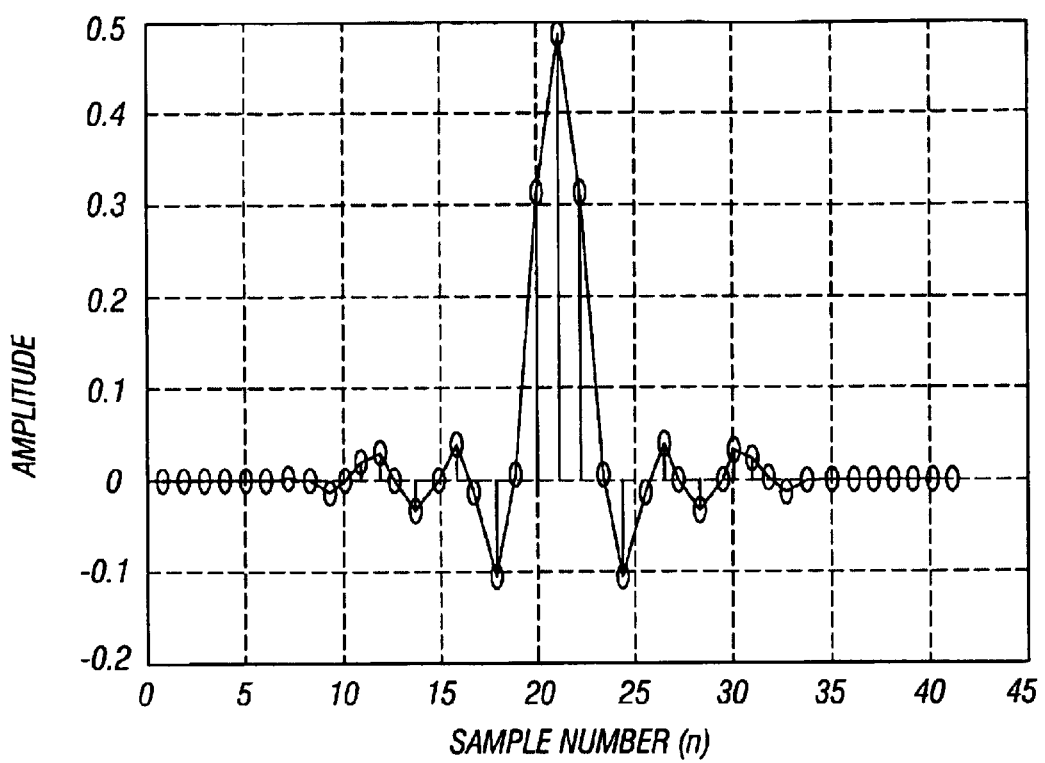
FIG. 6a is a plot of the self-convolution of the filter shown in FIG. 6.

The self-convolution of the filter is the product of transmit and receive transfer functions in the discrete time domain $(H(\omega) = H_T(\omega) H_R(\omega))$. The coefficients of the self-convolution of the filter, shown in FIG. 6a, to reduce ISI, are $|r(\pm j)| \approx 0$, for $j = 2, 4, \ldots, N$ where N is an even integer. A self-convolution of a function is a convolution of the function with itself. A convolution of one function with another is found by taking the product of the Fourier transforms of the two functions and untransforming the results.

The filter is an odd, symmetric, discrete-time SRRC filter with 21 filter coefficients. Table 1 lists all the coefficients of the discrete-time SRRC filter with an attenuation of 40 dB:

TABLE 1

| Coefficients | Value |
| --- | --- |
| C(0) | 0.51255235431472 |
| C(−1), C(1) | 0.31568047249281 |
| C(−2), C(2) | −0.01211631945676 |
| C(−3), C(3) | −0.09848831128045 |
| C(−4), C(4) | 0.01080637159348 |
| C(−5), C(5) | 0.05183182705160 |
| C(−6), C(6) | −0.00936393347915 |
| C(−7), C(7) | −0.03054537194965 |
| C(−8), C(8) | 0.00885487544702 |
| C(−9), C(9) | 0.02971918635933 |
| C(−10), C(10) | 0.00975086960867 |

The UTRA standard calls for a square root of mean squared error (SRMSE) of less than 17.5%. Using the coefficients set forth above, the square root of mean squared error is 9.48%, and the mean squared error is 1.8%.

Although SRRC filters have many advantages, in some applications, the desired computations involve too much power consumption and are too computationally complex for the processors that are available in a number of applications, including cellular telephones.

The output of a 21 tap FIR SRRC filter with odd symmetric coefficients can be expressed as:

$$y[n] = \sum_{k=0}^{20} C[n]x[n-k],$$

and may be expanded to be:

$$y[n] = \sum_{k=0}^{9} C[k]x[n-k] + C[10]x[n-10] + \sum_{k=0}^{9} C[20-k]x[n-20+k].$$

Because of the symmetrical relationship of the filter coefficients, the above equation can be reduced to the following:

$$y[n] = \sum_{k=0}^{9} C[k](x[n-k] + x[n-20+k]) + C[10]x[n-10].$$

Figure 7:
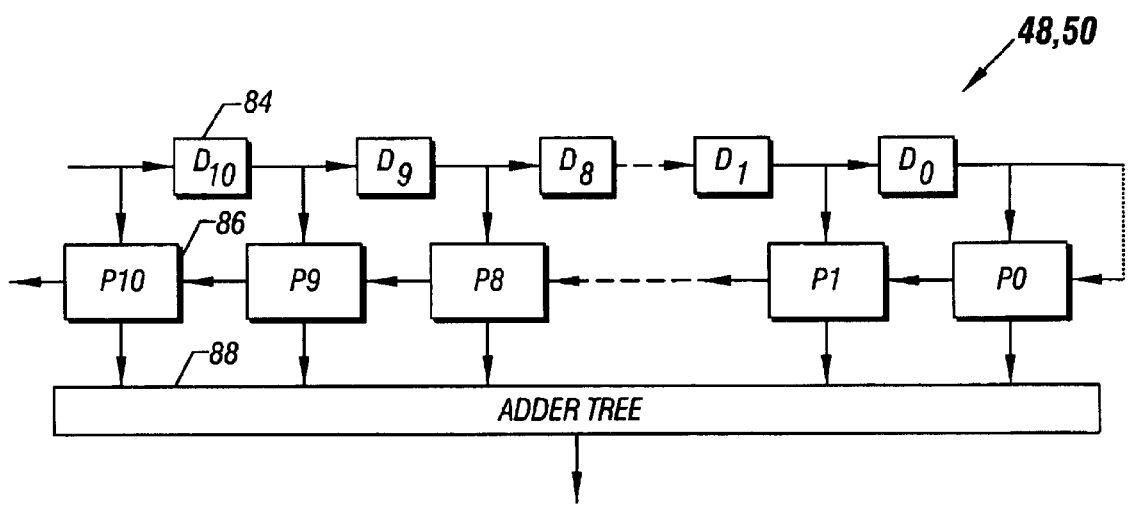
FIG. 7 is a block diagram for the multiply and accumulate (MAC) components shown in FIG. 4.

A discrete-time SRRC filter 48, 50, shown in FIG. 7, may include a plurality of delay stages 84, a plurality of processing units 86 and an adder tree 88. The filter may be designed to reduce the number of multiply-accumulate (MAC) operations and additions by exploiting the principles of data parallelism to implement an architecture with reduced computational complexity and reduced power consumption.

Figure 8:
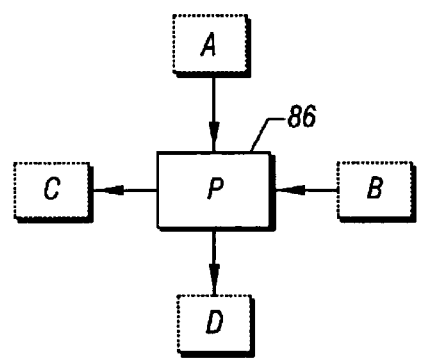
FIG. 8 is a block diagram of the processing units with inputs and outputs.

The filter coefficients C may be stored in the processing units 86 in appropriate registers therein. Each unit 86 may have two inputs, indicated as A and B, in FIG. 8, and two outputs indicated as C and D, in accordance with one embodiment of the invention.

Each processing element 86 executes the following equation:

$$D = (A+B) * K.$$

where K is the filter coefficient stored in the processing element 86. The output C is the input signal B passed through after one clock cycle delay. A and B are the input signals x(p) and x(20−p) for any integer p. As a result, the output signal from every processing unit 86 executes the term:

$$C[j](x[n-j]+x[n-20+j]) \text{ for } j=0,1,2,\ldots 9.$$

Summation of all these outputs from the basic processing elements 86 results in the output y(n). The outputs of the first twenty clock cycles are ignored. The result y(O) is produced in the twenty first clock cycle, y(1) is produced in the twenty second clock cycle and hence each filtered output is produced at each clock cycle thereafter. As a result, one hundred percent throughput may be achieved in one embodiment of the invention.

Figure 9:
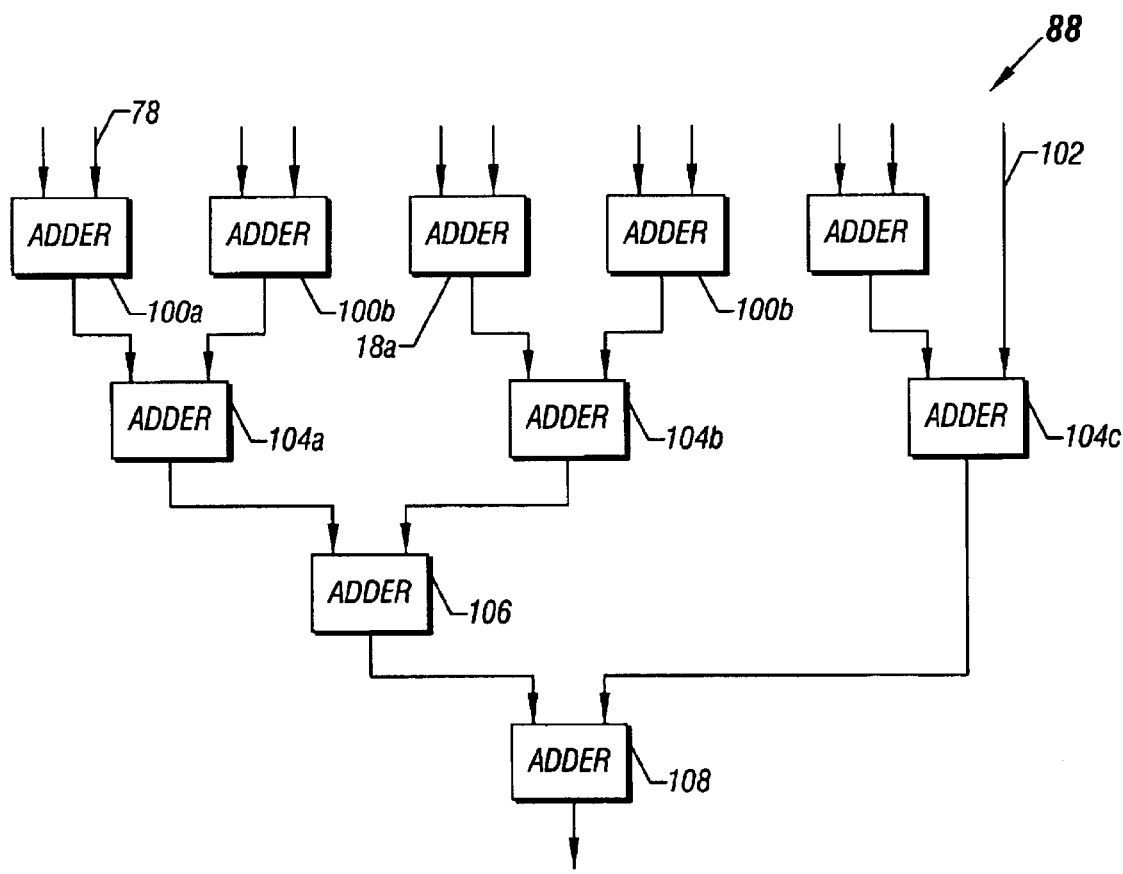
FIG. 9 is a block diagram of the adder tree shown in FIG. 7.

Referring to FIG. 9, the adder tree 88 may include adders 100a and 100b for each adjacent pair of processing units 86. The output 102 from the processing unit $P_0$ is passed directly to the second tier adder 104c. Similarly, the outputs from the adders 100 in the first tier of adders are passed to adders 104a and 104b in the second tier of adders. A third tier of adders 106 receive the outputs from pairs of second tier adders 104 and pass through its output to a fourth tier adder 108.

Figure 10:
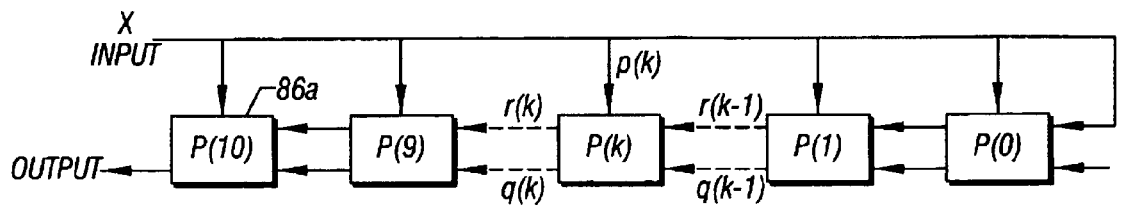
FIG. 10 is a block diagram showing another embodiment of the present invention.

In accordance with another embodiment of the present invention, shown in FIG. 10, instead of using the adder tree 88 to add all the outputs from the processing elements 86, a systolic architecture is implemented wherein the products may be accumulated using an adder inside each processing element 86a. A systolic architecture uses multiple interconnected processors, each processor doing the same operation, at a different stage of a unitary operation. In this way, the output signal may be generated for each input clock signal.

Each processing element 86a has three input signals. The input signal p(k) is a broadcast input signal and r(k−1) and q(k−1) are the two inputs coming from the previous processing element P(k−1). Two output signals r(k) and q(k) go to the input ports of the following processing element P(k+1).

Figure 11:
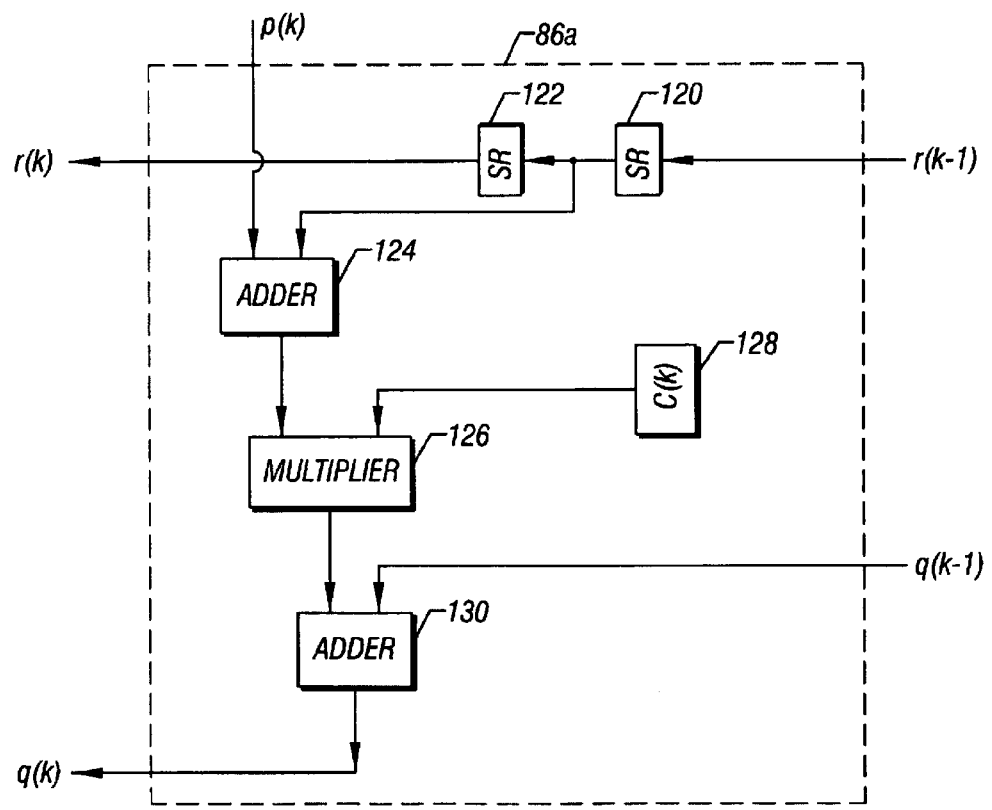
FIG. 11 is a more detailed block diagram showing one of the processing units shown in FIG. 10 in accordance with one embodiment of the present invention.

The logic circuitry for each processing element 86a is shown in FIG. 11, in one embodiment of the invention. Basically, the output r(k) of the processing element P(k) is the input signal r(k−1) which is passed through to the output of the processing element 86a after two clock delays. The clock delays may be provided by delay elements 120 and 122 which may be shift registers in one example. A register 128 in the processing element 86a can be programmed to initialize with the corresponding filter coefficient C(k). The output q(k) is the accumulated result q(k−1)+[p(k)+r(k−1)] *C(k). The adder 124 adds the broadcast input p(k) plus the input signal r(k−1) after having been subjected to a single delay by a delay element 120. The result of that addition is then multiplied in a multiplier 126 times the coefficient C(k) contained in the register 128. The result of the multiplication is then added to the input signal q(k−1) in the adder 130 to produce an output q(k). If the delay resulting from the processing by adders 124, 130 and multiplier 126 matches the delay provided by the delay element 122, no additional synchronization may be required. However, in some embodiments, additional clocking may be provided if desired.

Figure 12:
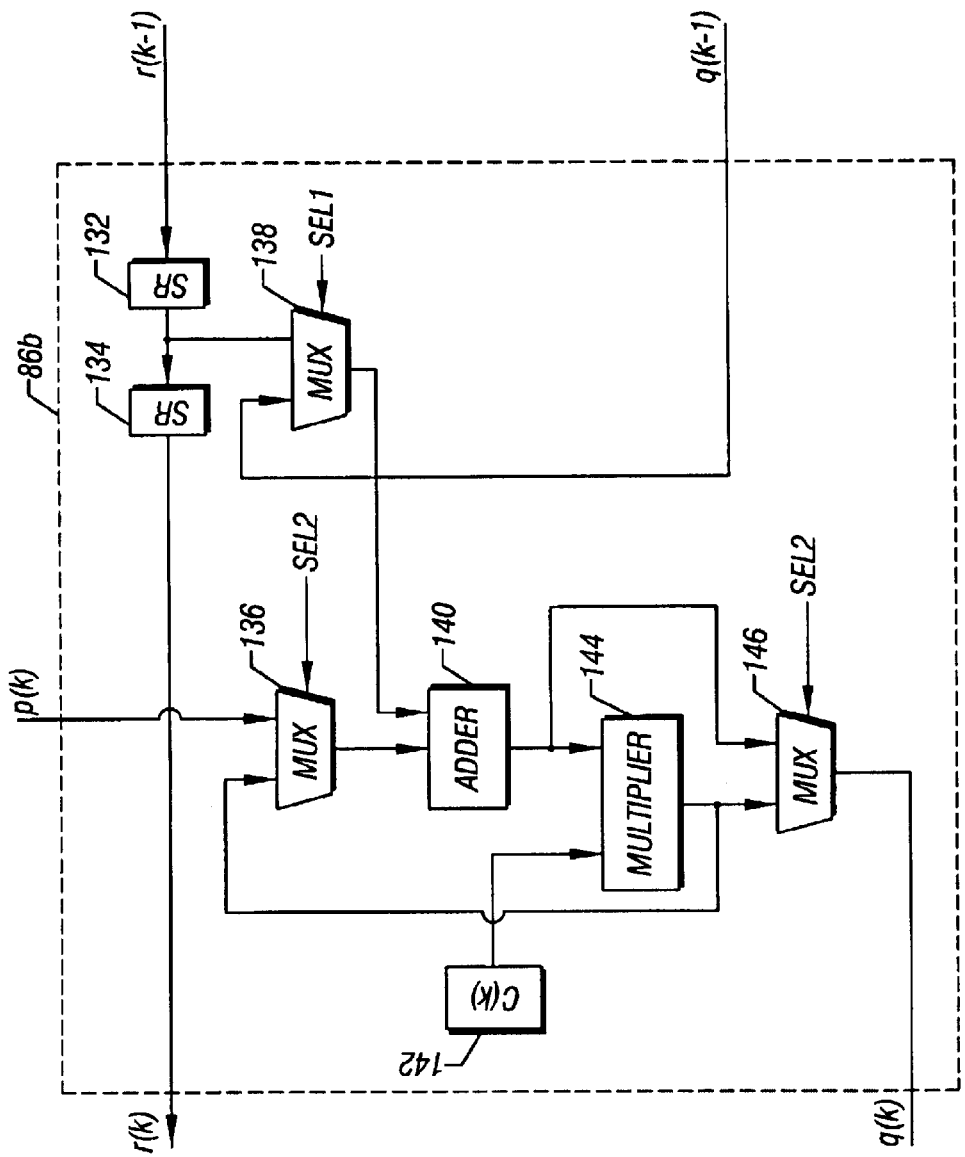
FIG. 12 is a more detailed block diagram of one of the processing units shown in FIG. 10 in accordance with another embodiment of the present invention.

By using control logic, such as the multiplexers 40 and control signals, one adder can be eliminated from each processing unit, as indicated in FIG. 12, in one embodiment of the invention. Thus, the circuit shown in FIG. 12 works like the circuit shown in FIG. 11 but the adder 130 may be eliminated. This may save cost and space in the resulting design. In this case, the multiplexers 136, 138 and 146 provide the appropriate signals so that the adder 140 may implement two additions. That is, in a first phase, indicated as select one (SEL1), the multiplexer 138 passes the signal r(k−1) (after having been delayed in a delay element 132) to the adder 140. The multiplexer 136 passes the signal p(k) so that p(k) is added to r(k−1) in the adder 140. That quantity is then multiplied by the coefficient C(k) (from the register 142) in the multiplier 144.

This result may then be passed back to the multiplexer 136 which passes the signal on to the adder 140 in the phase indicated as select two (SEL2). In this case, the adder 140 then adds the sum to the quantity q(k−1), which is passed by the multiplexer 138, in the phase SEL2, to the adder 140. The adder 140 does both additions. The output from the adder 140 is then passed around the multiplier 144 to the multiplexer 146 which passes that sum, in the phase two, as the output q(k).

In the embodiment shown in FIG. 12, an additional clock signal may be used to drive the select signals SEL1 and SEL2. The time period available for completing both phases is the time period of the delay element 122. The time may be split into two separately clocked phases. Alternatively, both the rising and falling edges of one clock may be used to implement the two phases.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A discrete-time square-root-raised-cosine filter comprising a symmetric finite impulse response filter, wherein coefficients of the filter are not equal to zero for even integer sample numbers and wherein coefficients of the self-convolution of the filter are approximately equal to zero for even integer sample numbers.

2. The filter of claim 1 having odd symmetric coefficients.

3. The filter of claim 1 having approximately 21 coefficients.

4. The filter of claim 1 having a systolic architecture.

5. The filter of claim 1 having one output signal per input clock cycle.

6. The filter of claim 1 including a plurality of processing units, each unit including a first delay element, and a multiply-accumulate circuit.

7. The filter of claim 6 including a second delay element to provide a delay approximately equal to the processing time of said multiply-accumulate circuit.

8. A wide band code division multiple access transceiver comprising:

an analog processing section; and a digital processing section coupled to said analog processing section, said digital processing section including an odd, symmetric, finite impulse response filter, said filter including a plurality of processing units to implement a systolic architecture, said filter to produce an output signal in response to each input clock signal, and said filter constructed to result in an self-convolution that exhibits coefficients approximately equal to zero for even integer sample numbers.

9. The transceiver of claim 8 wherein said filter includes a plurality of processing units, each unit including a first delay element and a multiply-accumulate circuit.

10. The transceiver of claim 9 including a second delay element to provide a delay approximately equal to the processing time of said multiply-accumulate circuit.

11. The transceiver of claim 10 including a sequencing circuit so that a single adder may be used to implement two different additions.

12. A method of implementing a code division multiple access receiver comprising:

receiving a code division multiple access signal;

generating symmetric finite impulse response filter coefficients;

generating an output ripple signal having a magnitude at a frequency of one-half of the chip rate of about three decibels less than the normalized gain; and causing the self-convolution of the filter to have coefficients that are approximately equal to zero for even integer sample numbers.

13. The method of claim 12 further including setting the edge of the stopband frequency to have ninety-nine percent of half of the occupied bandwidth.

14. A method of claim 12 including processing said received signal through a first filter having a systolic architecture.

15. The method of claim 12 further including causing the filter coefficients to be non-zero for even integer sample numbers.

16. A discrete-time square-root-raised-cosine filter as defined in claim 1, further comprising:

a first delay element having an output;

a second delay element having an input coupled to the output of the first delay element and having an output;

a first processor having a first input coupled to the output of the second delay element and having first and second outputs;

a second processor having a first input coupled to the output of the first delay element, a second input coupled to the first output of the first processor, and an output; and an adder tree having a first input coupled to the second output of the first processor, a second input coupled to the output of the second processor and an output to provide a filtered signal.

17. A discrete-time square-root-raised-cosine filter as defined in claim 16, wherein the processors are constructed to store coefficients of the filter.

18. A discrete-time square-root-raised-cosine filter as defined in claim 1, further comprising:

a first processor having an input to couple to an input signal and having a first output and a second output; and a second processor having a first input to couple to the input signal, a second input coupled to the first output of the first processor, and a third input coupled to the second output of the first processor.

19. A discrete-time square-root-raised-cosine filter as defined in claim 18, wherein the second processor comprises:

a first adder having a first input to couple to the input signal and a second input coupled through a delay element to the first output of the first processor;

a multiplier having a first input coupled to an output of the first adder, a second input to couple to a clock signal, and an output; and a second adder having a first input coupled to the output of the multiplier and a second input coupled to the second output of the first processor.

20. A discrete-time square-root-raised-cosine filter as defined in claim 18, wherein the second processor comprises:

a first multiplexer having an input to couple to the input signal;

a second multiplexer having a first input coupled though a delay element to the first output of the first processor and a second input coupled to the second output of the first processor; and an adder having a first input coupled to an output of the second multiplexer.

21. A discrete-time square-root-raised-cosine filter as defined in claim 20, wherein the second processor further comprises:

a multiplier having a first input coupled to an output of the adder and a second input to couple to a clock signal.

22. A discrete-time square-root-raised-cosine filter as defined in claim 21, wherein the second processor further comprises:

a third multiplexer having a first input coupled to an output of the multiplier and a second input coupled to the output of the adder.

23. A discrete-time square-root-raised-cosine filter as defined in claim 22, wherein the first multiplexer and the third multiplexer are constructed to be coupled to a source of a first select signal and the second multiplexer is constructed to be coupled to a source of a second select signal, the first and second select signals having respectively different phases.

* * * * *